(12) United States Patent
Feng et al.

(10) Patent No.: US 7,666,239 B2
(45) Date of Patent: *Feb. 23, 2010

(54) HYDROTHERMAL SYNTHESIS OF CERIUM-TITANIUM OXIDE FOR USE IN CMP

(75) Inventors: Xiangdong Feng, Upland, CA (US); Yie-Shein Her, Canandaigua, NY (US); Yi Yang, Broadview Heights, OH (US)

(73) Assignee: Ferro Corporation, Cleveland, OH (US)

( * ) Notice: Subject to any disclaimer, the term of this patent is extended or adjusted under 35 U.S.C. 154(b) by 501 days.

This patent is subject to a terminal disclaimer.

(21) Appl. No.: 11/283,530

(22) Filed: Nov. 18, 2005

(65) Prior Publication Data

US 2006/0112649 A1 Jun. 1, 2006

Related U.S. Application Data

(63) Continuation-in-part of application No. 10/851,684, filed on May 21, 2004, now abandoned, which is a continuation-in-part of application No. 10/255,136, filed on Sep. 25, 2002, now Pat. No. 6,818,030, which is a continuation-in-part of application No. 09/992,485, filed on Nov. 16, 2001, now Pat. No. 6,596,042.

(51) Int. Cl.
C09K 3/14 (2006.01)
C09G 1/02 (2006.01)
C01F 17/00 (2006.01)
C01B 15/04 (2006.01)

(52) U.S. Cl. .............. 51/309; 51/307; 106/3; 423/263; 423/584

(58) Field of Classification Search .......... 51/307, 51/309; 106/3; 438/692, 693; 501/152, 501/307, 309; 252/79.1; 423/263, 584; 216/89
See application file for complete search history.

(56) References Cited

U.S. PATENT DOCUMENTS

| 3,429,080 | A | | 2/1969 | Lachapelle | |
|---|---|---|---|---|---|
| 3,761,571 | A | * | 9/1973 | Woodhead | 423/263 |
| 4,601,755 | A | | 7/1986 | Melard et al. | |
| 4,786,325 | A | | 11/1988 | Melard et al. | |
| 5,002,747 | A | | 3/1991 | Le Loarer | |
| 5,011,671 | A | | 4/1991 | Le Loarer | |
| 5,279,789 | A | | 1/1994 | Le Loarer et al. | |
| 5,292,496 | A | * | 3/1994 | Nagashima et al. | 423/584 |
| 5,389,352 | A | | 2/1995 | Wang | |
| 5,759,917 | A | | 6/1998 | Grover et al. | |
| 5,891,412 | A | | 4/1999 | Le Loarer et al. | |
| 5,897,675 | A | * | 4/1999 | Mangold et al. | 51/309 |
| 5,962,343 | A | | 10/1999 | Kasai et al. | |
| 5,973,175 | A | * | 10/1999 | Bruno | 556/56 |
| 6,120,571 | A | | 9/2000 | Aihara et al. | |
| 6,221,118 | B1 | | 4/2001 | Yoshida et al. | |
| 6,387,139 | B1 | * | 5/2002 | Kido et al. | 51/309 |
| 6,596,042 | B1 | | 7/2003 | Feng et al. | |
| 6,615,499 | B1 | * | 9/2003 | Matsuzawa et al. | 51/309 |
| 6,786,944 | B2 | * | 9/2004 | Hattori et al. | 51/307 |
| 6,818,030 | B2 | | 11/2004 | Feng et al. | |

FOREIGN PATENT DOCUMENTS

EP 0875547 A2 11/1998
JP 01301517 A * 12/1989

OTHER PUBLICATIONS

Abstarct of CN 1314205 to Li et al. "Preparation of composite oxide material with high oxygen storage power", Sep. 26, 2001.*
Lakhwani et al., "Hydrothermal coarsening of CeO2 particles," 1999 Materials Research Society, J. Mater. Res., vol. 14, No. 4, Apr. 1999, pp. 1455-1461.

* cited by examiner

*Primary Examiner*—Jerry Lorengo
*Assistant Examiner*—Shuangyi Abu Ali
(74) *Attorney, Agent, or Firm*—Rankin, Hill & Clark LLP (57) ABSTRACT

The present invention provides a method of synthesizing abrasive particles and methods of using the same in chemical mechanical polishing slurry applications. The nanosized abrasive particles according to the invention are produced by hydrothermal synthesis using an insoluble source of cerium. The crystallites of the particles include cerium ions and titanium ions.

14 Claims, 4 Drawing Sheets

~500,000X
bar = ~10nm

Figure 2b

~1,000,000X
bar = ~10nm

Figure 3a

~500,000X
bar = ~10nm

Figure 3b

~1,000,000X
bar = ~10nm

Figure 4a
~500,000X
bar = ~10nm

Figure 4b
~1,000,000X
bar = ~10nm

HYDROTHERMAL SYNTHESIS OF CERIUM-TITANIUM OXIDE FOR USE IN CMP

RELATED APPLICATIONS

This application is a continuation-in-part of co-pending app. Ser. No. 10/851,684, filed May 21, 2004, which is a continuation-in-part of app. Ser. No. 10/255,136, filed Sep. 25, 2002, now U.S. Pat. No. 6,818,030, which is a continuation in part of app. Ser. No. 09/992,485, filed Nov. 16, 2001, now U.S. Pat. No. 6,596,042.

BACKGROUND OF THE INVENTION

1. Field of Invention

The present invention provides a process for producing abrasive particles, the abrasive particles produced according to the process, and a process for removing a film layer using a CMP slurry containing particles made by the process.

2. Description of Related Art

Chemical-mechanical polishing (CMP) slurries are used, for example, to planarize surfaces during the fabrication of semiconductor chips and related electronic components. CMP slurries typically include reactive chemical agents and abrasive particles dispersed in a liquid carrier. The abrasive particles perform a grinding function when pressed against the surface being polished using a polishing pad, and separately, the reactive chemical agents serve to oxidize the surface.

It is well known that the size, composition, and morphology of the abrasive particles used in a CMP slurry can have a profound effect on the polishing rate and surface finishing. Over the years, CMP slurries have been formulated using abrasive particles formed using, for example, alumina ($Al_2O_3$), cerium oxide, or ceria ($CeO_2$), iron oxide ($Fe_2O_3$), silica ($SiO_2$), silicon carbide (SiC), silicon nitride ($Si_3N_4$), tin oxide ($SnO_2$), titania ($TiO_2$), titanium carbide (TiC), tungsten oxide ($WO_3$), yttria ($Y_2O_3$), zirconia ($ZrO_2$), and combinations thereof.

Known abrasive particles for use in CMP slurries include colloidal silica, which is produced by condensation in aqueous solution. Another is fumed silica, which may be produced by a continuous flame hydrolysis technique involving the conversion of silicon tetrachloride ($SiCl_4$) to the gas phase using an oxy-hydrogen flame. Fumed silica is by far the most widely used abrasive particle.

Calcination is another method of producing abrasive particles for use in CMP slurries. During the calcination process, precursors such as carbonates, oxalates, nitrates, and sulfates, are converted into their corresponding oxides at very high temperature. After the calcination process is complete, the resulting oxides must be milled to obtain proper particle sizes and distributions to provide desired removal rates and to prevent scratching.

The calcination process, although widely used, does present certain disadvantages. For example, it tends to be energy intensive and can produce toxic and/or corrosive gaseous byproducts. In addition, contaminants are easily introduced during the calcination and subsequent milling processes. Finally, it is difficult to obtain a narrow particle size distribution.

The basic mechanism of the CMP process is the simultaneous formation of a removable surface layer, such as via oxidation of a metal surface or via hydrolysis of an oxide or nitride layer, coupled with the mechanical removal of the removable surface layer using abrasive particles pressed between a work piece and a polishing pad that are in motion relative to one another. In CMP slurries for removing copper films, the mechanical (abrasive) effect and oxidizing function are separately provided by the different components. That is, abrasive particles mainly contribute the mechanical effect, while chemical oxidizing agents give rise to a chemical (redox) reaction.

Numerous chemical additives exist to improve film removal rates, to adjust the selectivity of removal rates between various materials, and to allow better surface finishing and fewer defects. Hydrogen peroxide, ferric nitrate, potassium iodate and periodate are widely used as oxidizing chemicals in copper CMP slurries, to improve removal rates relative to slurries having only abrasive particles. Most CMP slurries are formed by combining two separate components, namely: (1) abrasive particles dispersed in a liquid medium; and (2) chemical additives (e.g., a chemical oxidizer). The separate components are mixed together immediately prior to use and, once blended, have a shelf life of typically only about 5 days or less. The chemical oxidizer in conventional CMP slurries tends to lose its oxidative efficacy if it remains unused for long periods.

While the use of chemical oxidizers improves the metal removal rate to industrially practicable levels, the chemical oxidizers in the slurry continue to oxidize metal until they are expended or removed. Hence, chemical oxidizers are one of main contributors to the problem of dishing or pitting of metal surfaces, which results from continued oxidative attack on an already planar metal surface, even in the absence of abrasive particles.

BRIEF SUMMARY OF THE INVENTION

Broadly, a process according to the invention involves producing abrasive oxide crystallites (primary particles) that include cations of cerium and titanium, which have been formed by hydrothermal synthesis. The abrasive particles can be used to formulate CMP slurries that provide industrially acceptable removal rates of a variety of surface films (substrates), without the need for added chemical oxidizers, thereby eliminating concerns about dishing and cupping. Slurries formulated using abrasive particles according to the invention exhibit a shelf life far greater than traditional CMP slurries. Another advantage provided by the abrasive particles according to the invention is that use of chemical oxidizers can be avoided, which reduces the environmental impact of producing electronic components.

A first embodiment of the invention provides a process of making a composite oxide of cerium and titanium comprising hydrothermally treating, at about 70 to about 500° C., a suspension of a deagglomerated, insoluble $Ce^{+4}$ or $Ce^{+3}$ source in the presence of a $Ti^{+4}$ source to form a slurry. The slurry is a composite oxide of cerium and titanium.

A second embodiment of the invention is a process of making a composite oxide comprising Ce and Ti for use in CMP, comprising contacting a cerium-titanium composite hydroxide with aqueous nitric acid to form a suspended precursor, and subjecting the suspended precursor to hydrothermal treatment in a closed vessel at a temperature of 70° C. to about 500° C. for about 0.1 to about 10 hours to form a slurry of composite oxide particles.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

The invention provides a method of synthesizing a cerium-titanium composite oxide for use in abrasive particles having a desired reactivity, where the particles can be used in formulating CMP slurries exhibiting a variety of substrate removal rates. The composite oxides may be used to make abrasive particles to polish metal substrates or metal oxide substrates. Both operations are routinely required in the manufacture of electronic components. The substrate removal rate of CMP slurries is believed to depend on numerous factors. A non-exhaustive list of such factors includes the composition of the abrasive particles; the relative level of titanium ions in those particles; primary particle size; secondary particle size; the concentration of abrasive particles in the slurry; the pH of the slurry; and the presence and concentration of chemical oxidizers in the slurry. The focus of the present invention is the control of primary and secondary particle size of the abrasive particles, and the control of the level of titanium ions in such primary particles. Chemically reactive abrasive particles according to the invention can be used in the CMP process to produce both chemical and mechanical effects.

It has been discovered that nanoscale composite ceria particles can be synthesized hydrothermally such that cerium oxide acts as a host matrix (crystal lattice structure) for titanium ions that take the place of cerium ions in that matrix. The inventive process produces crystallites having a mean diameter ($D_{50}$) in the range of about 1 nm to about 100 nm, preferably about 2 to about 50 nm, and more preferably about 5 to about 40 nm. Secondary particles, which are agglomerations of primary particles, exhibit sizes within the range of about 10 to about 1000 nm, but are preferably about 15 nm to about 500 nm, and more preferably about 20 to about 300 nm. Throughout the specification and the appended claims, the term "particle" when used without further explanation refers to secondary particles.

The titanium ions, ($Ti^{+4}$) are substituted for cerium ions in a cerium oxide ($CeO_2$) crystal lattice structure, thus preserving the ratio of metal cations to oxygen ions in such crystal. Thus, for cerium oxide, the mole ratio of metal ions (or cations) to oxygen ions in the crystal lattice structure will be about 1:2, although mole ratios of metal ions to oxygen ions of about 1:1 to 1:2 are possible. The ratio of metal ions (cerium ions+titanium ions) to oxygen ions in the crystal is sufficient to preserve overall statistical electroneutrality. The resultant composite metal oxide formula is thus $Ce_xTi_yO_z$, where x+y is about 1 and z is within the range of about 1 to about 2. Because the titanium ions (1) may have a different oxidation state than cerium and/or (2) have a different electronegativity than cerium, the difference in electrical potential is generally sufficient to drive a redox reaction on the surface of a film to be polished when the abrasive particles according to the invention are in contact therewith. Films or substrates that can be polished (removed) using abrasive particles according to the invention include exemplary metals such like copper and silicon, metal oxides, metal nitrides, silicides, and polymers.

Details on the inventive abrasive particles, as well as the process conditions to make such particles, and ingredients in such process follow.

Cerium and Titanium Sources. Suitable sources of cerium may contain either the ceric ($Ce^{+4}$) or cerous ($Ce^{+3}$) ion. Sources of the $Ce^{+4}$ ion include $Ce(OH)_4$ or a composite cerium-titanium hydroxide, represented by $(Ce_nTi_{1-n})(OH)_4$, where 0<n<1. In a composite hydroxide, the molar ratio of cerium ion ($Ce^{+4}$ or $Ce^{+3}$) to $Ti^{+4}$ may be about 20:1 to about 2:1, preferably about 19:1 to about 3:1. The $Ce^{+4}$ source may also be one or more of the fluoride, phosphate, carbonate or oxalate of cerium or other $Ce^{+4}$ sources that are insoluble in aqueous solution. The source of cerium can also be compounds containing the cerous ion ($Ce^{+3}$), wherein the cerous compounds are converted to $Ce^{+4}$ compounds during the process where sufficient oxygen is present to oxidize $Ce^{+3}$ to $Ce^{+4}$ or when an oxidizer such as a peroxide (e.g., $H_2O_2$) is intentionally added. If the cerium source is a cerous compound, it also must be insoluble in aqueous solution.

The composite cerium-titanium hydroxide may also be used as the titanium source. Other suitable sources of titanium include organotitanium compounds, such as titanium alkoxides like titanium-acetylacetone, titanium isopropoxide or titanium (IV) triethanolaminato isopropoxide. Soluble titanium salts may also be used, such as the halides, perhalides, oxyhalides, nitrates, sulfates, phosphates, carbonates, and acetates of titanium.

Suspension. Because $Ce(OH)_4$ and $(Ce,Ti)(OH)_4$ precursors are not water soluble, they are suspended in water, forming a slurry. In one embodiment, the precursor may be deagglomerated prior to hydrothermal treatment to a secondary particle $D_0$ of less than about 20 microns using a bead mill. $D_0$ is the maximum particle size in a sample. In another embodiment, the precursor may be deagglomerated prior to hydrothermal treatment to a $D_0$ of less than about 100 microns by using an acid such as $HNO_3$ in conjunction with high shear mixing. In the latter case, precursors are suspended in aqueous $HNO_3$, with the amount of $HNO_3$ being equal to about 0.005 to about 6.0% (i.e., 1/20000 to about 6/100) of the weight of the precursor, preferably about 0.01% to about 0.6%, and more preferably, 0.05% to about 0.2%.

The acidified precursor is mixed at high shear to ensure a suspension that will not settle prior to hydrothermal treatment. For example, the acidified precursor may be mixed at about 100 rpm to about 10,000 rpm for about 1 to about 200 minutes. In order to ensure complete reaction and maximum surface area, prior to hydrothermal treatment, the acidified precursor is deagglomerated to a secondary particle size of less than about 50 microns, preferably less than about 20 microns.

Hydrothermal Treatment. Hydrothermal treatment is carried out in a closed container because the pressure generated by the raised temperature results in small particles having a narrow size distribution resulting from uniform crystal growth. The solution may be further diluted with deionized water as needed. The suspended acidified deagglomerated precursor is transferred to a sealed stainless steel reaction vessel, and subjected to hydrothermal treatment at a temperature of about 100° C. to about 500° C., preferably about 200 to about 400° C., more preferably about 250 to about 350° C. to produce the abrasive particles. The reaction time is about 0.1 to about 500 hours, preferably about 1 to 50 hours, more preferably about 1 to 10 hours. Reaction pressures may reach 100 atmospheres or more, for example 50-100 atmospheres or 60-90 atmospheres. The vessel is then cooled to room temperature, excess water is decanted, while maintaining the slurry pH at about 3.5 to about 4.5, more preferably 3.7 to about 4.3, still more preferably 3.9 to about 4.1 with a base such as aqueous $NH_4OH$, or an acid such as $HNO_3$, and the slurry is further mixed and washed until a low conductivity is achieved, typically less than 5 mS, preferably less than 1 mS, more preferably less than 0.5 mS and most preferably less than 0.2 mS. As a final purifying step, the particles may be filtered using micron range filter paper such as 1 micron or 5 micron paper. The filters are preferably first rinsed with deionized water. Depending on the relative molar amounts of Ce and Ti ions in the crystal structure, the crystallites will exhibit a generally $CeO_2$ lattice or a generally $TiO_2$ lattice with the atom in lower concentration as a guest ion.

The composite particles according to the invention can be used as chemically reactive abrasives in CMP slurries to remove metal film layers such as copper without the need for added oxidizers. Metals that can be polished by the inventive methods include silicon silver, gold, platinum, copper, palladium, nickel, cobalt, iron, ruthenium, iridium, and osmium, silicon, aluminum, germanium, tungsten, tantalum and alloys or blends thereof.

Metal oxides, nitrides, silicides and polymers may also be polished effectively. Metal oxides that can be polished by the inventive methods include oxides of metals such as boron, sodium, magnesium, aluminum, silicon, phosphorus, potassium, calcium, gallium, germanium, arsenic, selenium, rubidium, strontium, yttrium, zirconium, tin, antimony, cesium, and barium. Metal oxide substrates may also contain more than one of the aforementioned oxides.

Low K-value dielectric materials may also be polished. Many of these are polymeric, for example poly-para-xylenes commercially available from S.C. Cookson, of Indianapolis, Ind., under the Parylene tradename. Other such polymers include fluorinated polyimides, methyl silsesquioxanes, and poly-(arylene) ethers. The Dow Chemical Company, of Midland, Mich., commercially supplies B-staged polymers including those sold by under the Cyclotene® and SiLK® trademarks. For example, Cyclotene® 4026-46 is a blend of B-staged divinylsiloxane-bis-benzocyclobutene, mesitylene, polymerized 1,2-dihydro-2,2,4-trimethylquinoline, 2,6-bis{(4-azidophenyl) methylene}-4-ethylcyclohexanone, and 1-1' (1-methylethylidene) bis{4-(4-azidophenoxy)benzene}. In general, the Cyclotene® dielectric polymers contain at least B-staged divinylsiloxane-bis-benzocyclobutene and mesitylene. Polymers sold under the SiLK® trademark are semiconductor dielectric resins comprise a Dow proprietary b-staged polymer, cyclohexanone, and gamma-butyrolactone. In addition, carbon doped silica substrates, which are also known as SiCOH substrates, can be polished.

The difference in valence state and/or electronegativity between cerium ions and the titanium ions in the abrasive particles as well as the ability of cerium to bind and release oxygen according to the invention provides the redox potential to chemically remove films. Hence, it is believed that such oxidation occurs only when a particle contacts the substrate surface, and consequently, that oxidation and mechanical abrasion occur simultaneously. This fact, combined with the small particle size disclosed herein (nanoscale) provides extremely precise polishing, and planarization that is both locally and globally accurate. Thus, the invention further provides a method of removing a film by CMP at a desired rate in the absence of chemical oxidizers.

When all other polishing conditions remain the same, adjustments in the relative molar percentage of titanium ions as well as the sources of cerium and titanium ions in the crystal lattice structure of the abrasive particles according to the invention can be used to determine or tune the rate of film removal. Thus, the invention facilitates determining the rate of removal of a film layer by selecting the composition and morphology of the abrasive, rather than adjusting other polishing parameters.

Because the particles of the present invention are so small, i.e., primary particle diameters on the order of nanometers, a very high fraction of the ions reside at the particle crystalline surfaces and grain boundaries. As primary particle size decreases, the BET specific surface area (typically expressed in $m^2/gram$) increases. It is believed that nanoparticles are much more reactive than the corresponding bulk material due to vastly increased specific surface area. It is further believed that surface defects, non-balanced charges, titanium ions in the grain boundary and vacancies in the crystalline lattice and other surface active sites may beneficially induce or catalyze chemical redox reactions.

The inventive abrasive particles alone—absent oxidizers and other chemical additives—can be used to achieve a wide range of satisfactory removal rates on a variety of substrates as disclosed herein. However, in a further embodiment of the invention the polishing performance of any inventive abrasive particle herein can be further adjusted by the use of chemical additives, including oxidizers. Such chemical additives include, for example, hydrogen peroxide, ascorbic acid, citric acid, formic acid, acetic acid, propionic acid, butyric acid, valeric acid, acrylic acid, lactic acid, succinic acid, nicotinic acid, oxalic acid, malonic acid, tartaric acid, malic acid, glutaric acid, citric acid, maleic acid, and glycine. Those skilled in the art will be familiar with other such additives.

The following examples are intended only to illustrate the invention and should not be construed as imposing limitations upon the claims.

EXAMPLES

Example 1

Into separate five-gallon hydrothermal reaction vessels were placed 2.6 gallons (9.8 liters) of a suspension containing water, a mixed $(Ce,Ti)(OH)_4$ precursor, and concentrated nitric acid. According to the samples in Table 1, the suspension contained 10 wt % or 15 wt % of the mixed $(Ce,Ti)(OH)_4$ precursor. The $(Ce,Ti)(OH)_4$ precursor contained $Ce^{+4}$ ions and $Ti^{+4}$ ions in a either a 19:1 ratio or a 9:1 ratio, corresponding to a $Ti^{+4}$ content of 5 mol % or 10 mol %, respectively. For each sample, 5.91 grams of concentrated nitric acid solution was used. In all Examples herein, the $HNO_3$ solution is 16 M, about 70 wt %.

Figure 1:
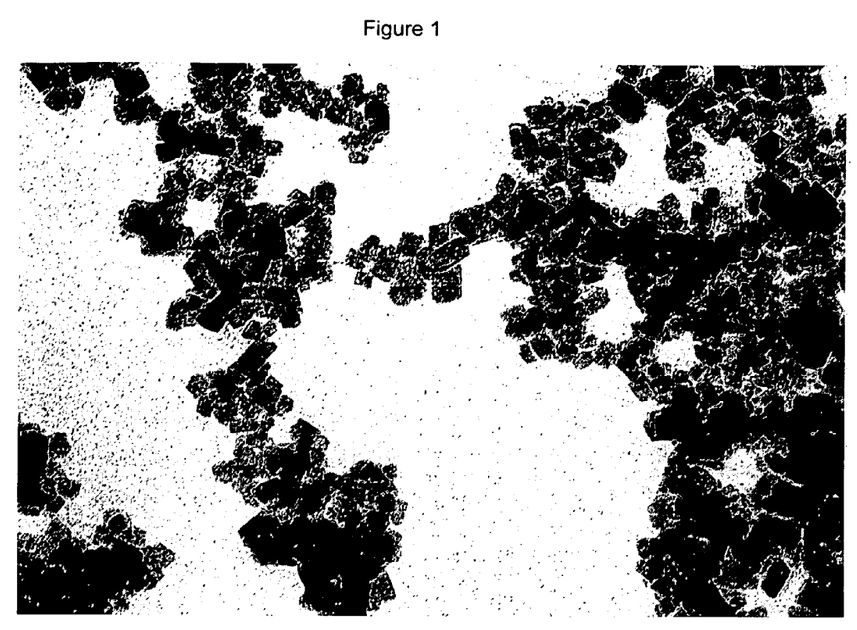
FIG. 1 is a transmission electron photomicrograph of composite oxide particles of the invention.

The suspension was mixed for 30-120 minutes at a shear rate of about 4,000-14,000 rpm, and subjected to hydrothermal treatment for about 1 to about 6 hours at 300° C. to form a composite oxide slurry. The composite oxide slurry was cooled to room temperature, excess water is decanted, and the pH adjusted to 4.0±0.5 with $NH_4OH$. Additional water was added to the oxide slurry, and mixed for a further 30-120 minutes. The suspension was washed with water until its conductivity was below 200 µS, the pH adjusted to 4.0±0.5 with $HNO_3$, deagglomerated to a secondary particle size of less than 1 micron, and filtered through filters rinsed with pH adjusted water (4.0±0.1). X-ray diffraction with a Philips APD 3720 system was used to determine crystallite sizes, as presented in Table 1, below. FIG. 1 is a transmission electron photomicrograph (at 500,000×) of composite oxide particles of Example 1, Sample 6, having a cubic crystal shape.

TABLE 1

Example 1 reaction conditions and crystallite size of composite (Ce,Ti)O₂ abrasive.

| Sample ID | wt % mixed (Ce,Ti)(OH)₄ precursor | Mol % TiO₂ in precursor | Reaction Time (h) | Crystallite Size (nm) |
|---|---|---|---|---|
| 1-1 | 10 | 5 | 1.5 | 8 |
| 1-2 | 10 | 5 | 3 | 9 |
| 1-3 | 10 | 5 | 4 | 16 |
| 1-4 | 10 | 5 | 4 | 12 |
| 1-5 | 10 | 5 | 4 | 25 |
| 1-6 | 10 | 5 | 4 | 10 |
| 1-7 | 10 | 5 | 6 | 16 |
| 1-8 | 10 | 10 | 1.5 | 12 |
| 1-9 | 10 | 10 | 3 | 14 |
| 1-10 | 10 | 10 | 4 | 12 |
| 1-11 | 10 | 10 | 6 | 9 |
| 1-12 | 15 | 5 | 1.5 | 9 |
| 1-13 | 15 | 5 | 3 | 7 |
| 1-14 | 15 | 5 | 6 | 7 |
| 1-15 | 15 | 10 | 1.5 | 14 |
| 1-16 | 15 | 10 | 3 | 7 |
| 1-17 | 15 | 10 | 6 | 11 |

Example 2

Figure 2A:
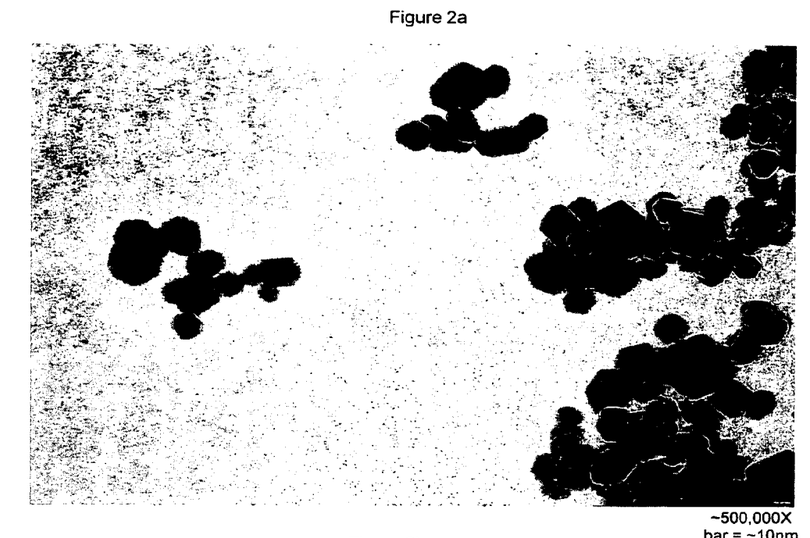
FIGS. 2a and 2b are transmission electron photomicrographs of composite oxide particles of the invention.
Figure 2B:
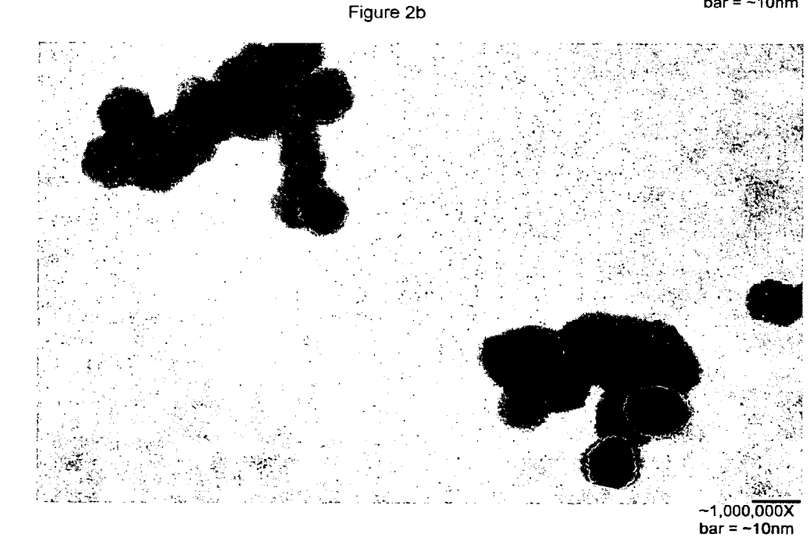

Into a first container 4.43 grams of concentrated $HNO_3$ was mixed into 5 liters of water. Under mixing, 1476 g (7.08 moles) of $Ce(OH)_4$ was added, and the resulting slurry was stirred for 2.5 hours. Into a second container 4.43 grams of $HNO_3$ was mixed at 5000 RPM into 1 liter of water. Titanium-isopropoxide, (62.9 g, 0.22 moles) of was mixed into the second container at 10,000 RPM for 15 minutes to form a titanium solution. After a further mixing of the $Ce(OH)_4$ for 10 minutes, the Ti-solution was quickly added to the $Ce(OH)_4$ slurry from step under lab mixing. The overall slurry mixture was diluted with DI-water to make a total volume of 9.7 liters, and mixed for another 60 minutes. The slurry was treated in an autoclave (hydrothermal treatment) for 4 hours at 300° C. The reacted slurry was allowed to settle, excess fluid was decanted, and the slurry was washed with pH 4 water. FIG. 2 is a transmission electron photomicrograph (at 500,000×) of composite oxide particles of Example 2, having a hexagonal crystal shape.

Example 3

Figure 3A:
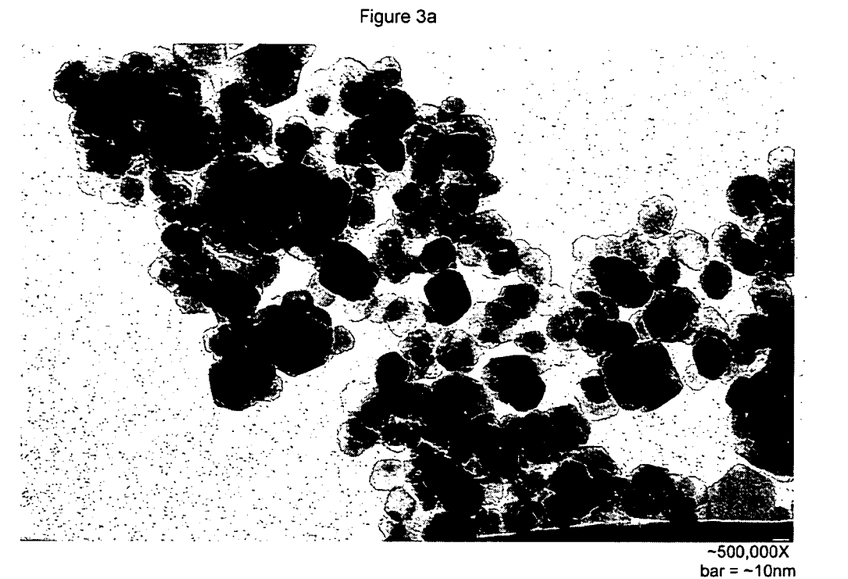
FIGS. 3a and 3b are transmission electron photomicrographs of composite oxide particles of the invention.
Figure 3B:
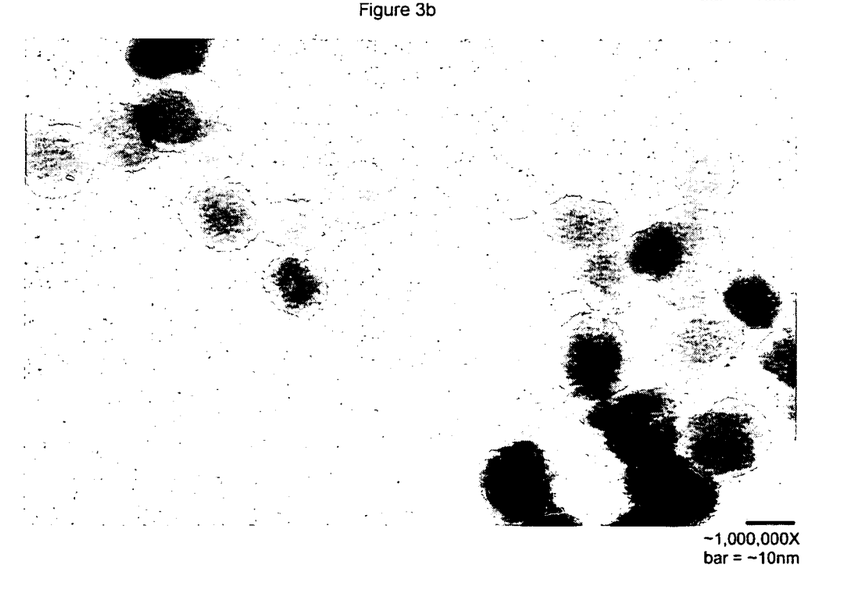

A cerium hydroxide slurry was formed by adding 1500 g (7.21 moles) of ball-milled $Ce(OH)_4$ to a 0.1 wt % solution of $HNO_3$. A titanium solution was formed by first adding 3.8 g $HNO_3$ to 810 g water in a beaker, followed by adding 87.3 g (0.35 moles) titanium-acetyl acetone under stirring. The titanium solution was quickly added to the cerium hydroxide slurry under lab mixing, and the overall slurry was diluted to a volume of 9.7 liters with deionized water, and mixed for another 60 minutes. The slurry was treated in an autoclave (hydrothermal treatment) for 6 hours at 300° C. The reacted slurry was allowed to settle, excess fluid was decanted, and the slurry was washed with pH 4 water. FIGS. 3a and, 3b are transmission electron photomicrographs (at 500,000× and 1,000,000×) of composite oxide particles of Example 3, having a hexagonal crystal shape.

Example 4

Figure 4A:
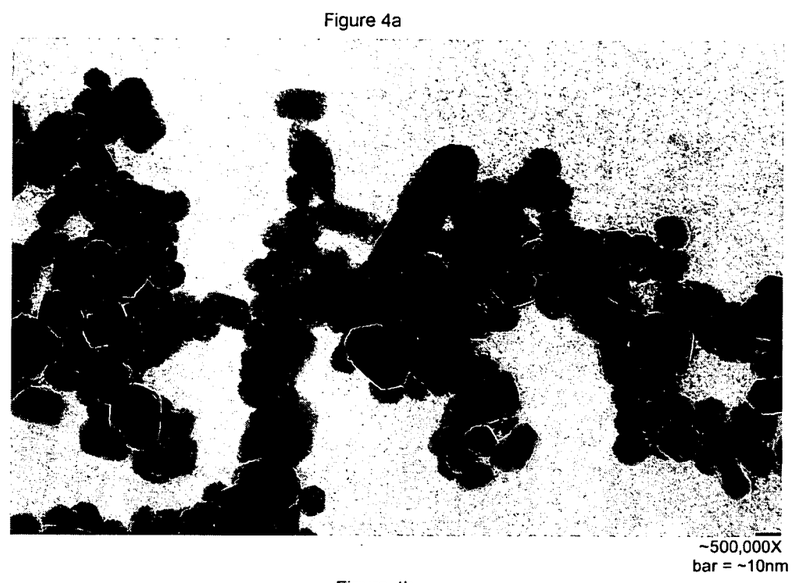
FIGS. 4a and 4b are transmission electron photomicrographs of composite oxide particles of the invention.
Figure 4B:
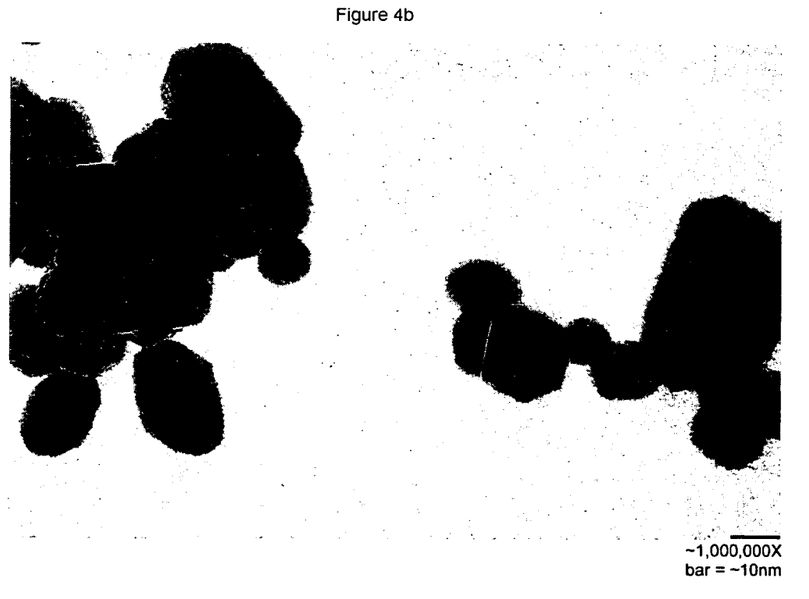

A cerium hydroxide slurry was formed by adding 1968 g (9.45 moles) of $Ce(OH)_4$ to 5 liters of a 0.1 wt % solution of $HNO_3$ and stirring 12 hours. Titanium-isopropoxide (83.8 g, 0.29 mol) was added to 1 liter of water under mixing at 5000 RPM, followed by 15 minutes at 10,000 RPM to form a titanium solution. The titanium solution was quickly added to the cerium hydroxide slurry under lab mixing, and the overall slurry was diluted to a volume of 9.7 liters with deionized water, and mixed for another 60 minutes. The slurry was treated in an autoclave (hydrothermal treatment) for 2 hours at 300° C. The reacted slurry was allowed to settle, excess fluid was decanted, and the slurry was washed with pH 4 water. FIGS. 4a and 4b are transmission electron photomicrographs (at 500,000× and 1,000,000×) of composite oxide particles of Example 4, having a hexagonal crystal shape.

Example 5

Into separate five-gallon hydrothermal reaction vessels were placed 2.6 gallons (9.8 liters) of a suspension containing water, a mixed $(Ce,Ti)(OH)_4$ precursor, and concentrated nitric acid, according to Table 2. The $(Ce,Ti)(OH)_4$ precursor had a $Ti^{+4}$ content of 15 mol % or 20 mol %. The precursor was dispersed in aqueous $HNO_3$ using a Sweeco Bead mill to a $D_O$ size of 5.122 microns. The reaction mixtures were subjected to hydrothermal treatment for 6 hours each to afford the $(Ce,Ti)O_2$ crystallite size in Table 2.

TABLE 2

Example 5 reaction conditions and crystallite size of composite (Ce,Ti)O₂.

| Sample ID | wt % mixed (Ce,Ti)(OH)₄ precursor | Mol % TiO₂ in precursor | HNO₃ added (g of 16 M solution) | Final pH | $D_O$ (microns) | Reaction Time (h) | Crystallite Size (nm) |
|---|---|---|---|---|---|---|---|
| 5-1 | 13.54 | 15 | 11.81 | 4.34 | 5.122 | 6 | 13 |
| 5-2 | 15.4 | 20 | 38.78 | 4.52 | 5.122 | 6 | 14.7 |

Example 6

Into a five-gallon hydrothermal reaction vessel was placed 2.6 gallons (9.8 liters) of a suspension containing water, a mixed $(Ce,Ti)(OH)_4$ precursor, and concentrated nitric acid according to Table 3. The precursor was dispersed in aqueous $HNO_3$ using an Attritor Bead mill to a $D_O$ of 6.72 microns. The reaction mixture was subjected to hydrothermal treatment for 4 hours to afford $(Ce,Ti)O_2$ having a crystallite size of 14.4 microns.

TABLE 3

Example 6 reaction conditions and crystallite size of composite $(Ce,Ti)O_2$.

| Sample ID | wt % mixed $(Ce,Ti)(OH)_4$ precursor | Mol % $TiO_2$ in precursor | $HNO_3$ added (g of 16 M solution) | Final pH | $D_O$ (microns) | Reaction Time (h) | Crystallite Size (nm) |
|---|---|---|---|---|---|---|---|
| 6-1 | 20 | 15 | 8.86 | 4.36 | 6.720 | 4 | 14.4 |

Example 7

Into separate five-gallon hydrothermal reaction vessels were placed 2.6 gallons (9.8 liters) of a suspension containing water and a mixed $(Ce,Ti)(OH)_4$ precursor. The suspensions contained 12, 17.1, or 20 wt % of mixed $(Ce,Ti)(OH)_4$ precursor, while the $(Ce,Ti)(OH)_4$ precursor had a $Ti^{+4}$ content of 10 mol %. The precursor was dispersed in water using an Attritor Bead mill to a $D_O$ shown in Table 4. The reaction mixtures were subjected to hydrothermnal treatment for 6 hours to afford $(Ce,Ti)O_2$ having crystallite sizes shown in Table 4.

TABLE 4

Example 7 reaction conditions and crystallite size of composite $(Ce,Ti)O_2$.

| Sample ID | wt % mixed $(Ce,Ti)(OH)_4$ precursor | Mol % $TiO_2$ in precursor | $HNO_3$ added (g of 16 M solution) | Final pH | $D_O$ (microns) | Reaction Time (h) | Crystallite Size (nm) |
|---|---|---|---|---|---|---|---|
| 7-1 | 12 | 10 | 0 | 5.30 | 7.697 | 6 | 12.7 |
| 7-2 | 17.1 | 10 | 0 | 5.39 | 6.720 | 6 | 14.7 |
| 7-3 | 20 | 10 | 0 | 5.60 | 7.697 | 6 | 12.9 |

Example 8

Into separate five-gallon hydrothermal reaction vessels was placed 2.6 gallons (9.8 liters) of suspensions containing water, a mixed $(Ce,Ti)(OH)_4$ precursor, and potassium hydroxide. The suspensions contained 10 or 10.2 wt % of mixed $(Ce,Ti)(OH)_4$ precursor, while the $(Ce,Ti)(OH)_4$ precursor had a $Ti^{+4}$ content of 10 or 15 mol %. The cerium in Sample 8-1 was provided by mixing $(Ce,Ti)(OH)_4$ and $Ce(OH)_4$ in a molar ratio of 1:1. The precursors were dispersed in DI water using an Attritor Bead mill to the $D_0$ in the 5 and then the slurry was titrated using an aqueous solution of KOH to a pre-reaction pH shown in Table 5. The reaction mixtures were subjected to hydrothermal treatment for 6 hours to afford $(Ce,Ti)O_2$ having crystallite sizes shown in Table 5.

TABLE 5

Example 8 reaction conditions and crystallite size of composite $(Ce,Ti)O_2$ abrasive.

| Sample ID | wt % mixed $(Ce,Ti)(OH)_4$ precursor | Mol % $TiO_2$ in precursor | KOH added (g) | Final pH | $D_O$ (microns) | Reaction Time (h) | Crystallite Size (nm) |
|---|---|---|---|---|---|---|---|
| 8-1 | 10 | 10 | 58.8 | 9.28 | 11.56 | 6 | 15.6 |
| 8-2 | 10.2 | 15 | 168.0 | 9.49 | 67.52 | 6 | 14.8 |

The invention claimed is:

1. A process of making a composite oxide of cerium and titanium comprising: hydrothermally treating, at about 70 to about 500° C., a suspension of deagglomerated composite hydroxide of cerium and titanium in the presence of a $Ti^{+4}$ source to form a slurry.

2. A process of making a composite oxide of cerium and titanium comprising: hydrothermally treating, at about 70 to about 500° C., a suspension of a deagglomerated, insoluble $Ce^{+4}$ or $Ce^{+3}$ source in the presence of a $Ti^{+4}$ source to form a slurry wherein, prior to hydrothermal treatment, the suspension is deagglomerated to a secondary particle size of less than about 20 microns.

3. A process of making a composite oxide of cerium and titanium comprising: hydrothermally treating, at about 70 to about 500° C., a suspension of deagglomerated $Ce(OH)_4$ in the presence of a $Ti^{+4}$ source to form a slurry.

4. A process of making a composite oxide of cerium and titanium comprising:
   hydrothermally treating, at about 70 to about 500° C., a suspension of a deagglomerated, insoluble $Ce^{+4}$ or $Ce^{+3}$ source in the presence of a $Ti^{+4}$ source to form a slurry; the process further comprising:
   a. cooling the composite oxide slurry to room temperature,
   b. decanting excess water from the composite oxide slurry,
   c. adjusting the pH of the composite oxide slurry to 4.0±0.5,
   d. adding water to the composite oxide slurry,
   e. mixing the composite oxide slurry for 1-120 minutes,
   f. washing the composite oxide slurry with water,
   g. adjusting the composite oxide slurry pH to 4.0±0.5,
   h. deagglomerating the composite oxide slurry to afford particles having an average secondary particle size of less than 1 micron, and
   i. filtering the particles.

5. The process of claim 2, wherein the $Ce^{+4}$ or $Ce^{+3}$ source is selected from the group consisting of a hydroxide, fluoride, carbonate, phosphate, or oxalate of cerium.

6. The process of claim 5 wherein the $Ti^{+4}$ source is a soluble titanium compound.

7. The process of claim 5 wherein the $Ti^{+4}$ source is selected from the group consisting of the halides, perhalides, oxyhalides, nitrates, sulfates, phosphates, carbonates, and acetates of titanium, and organotitanium compounds.

8. The process of claim 5 wherein the $Ti^{+4}$ source is a titanium alkoxide.

9. The process of claim 5 wherein the $Ti^{+4}$ source is titanium-acetylacetone or titanium (IV) triethanolaminato isopropoxide.

10. The process of claim 1, wherein the molar ratio of $Ce^{+4}$ or $Ce^{+3}$ to $Ti^{+4}$ is about 19:1 to about 2:1.

11. The process of claim 1, wherein the suspension comprises $HNO_3$, and wherein the weight ratio of $HNO_3$ to the $Ce^{+4}$ or $Ce^{+3}$ source is about 1/20000 to about 6/100.

12. A process of making a composite oxide of cerium and titanium comprising: hydrothermally treating, at about 70 to about 500° C., a suspension of a deagglomerated, insoluble $Ce^{+4}$ or $Ce^{+3}$ source in the presence of a $Ti^{+4}$ source to form a slurry, wherein the $Ce^{+4}$ or $Ce^{+3}$ source is a composite hydroxide of cerium and titanium, wherein the suspension comprises $HNO_3$, and wherein the weight ratio of $HNO_3$ to the $Ce^{+4}$ or $Ce^{+3}$ source is about 1/20000 to about 6/100, and wherein, prior to hydrothermal treatment, the suspension is deagglomerated to a secondary particle size of less than about 100 microns.

13. A process of making a composite oxide comprising Ce and Ti for use in CMP, comprising:
   a. contacting a cerium-titanium composite hydroxide with aqueous nitric acid to form a suspended precursor, and
   b. subjecting the suspended precursor to hydrothermal treatment in a closed vessel at a temperature of 70° C. to about 500° C. for about 0.1 to about 10 hours to form a slurry of composite oxide particles.

14. A process of making a composite oxide comprising Ce and Ti for use in CMP, comprising:
   a. contacting a cerium-titanium composite hydroxide with aqueous nitric acid to form a suspended precursor, and
   b. subjecting the suspended precursor to hydrothermal treatment in a closed vessel at a temperature of 70° C. to about 500° C. for about 0.1 to about 10 hours to form a slurry of composite oxide particles, wherein:
   a. prior to hydrothermal treatment
      i. the weight ratio of $HNO_3$ to the $Ce^{+4}$ source is about 1/20000 to about 6/100,
      ii. the suspended precursor is mixed for about 1 to about 120 minutes at a shear rate of about 1000 to about 10,000 RPM, and
   b. after hydrothermal treatment,
      i. the suspension is cooled to room temperature,
      ii. excess liquid is decanted from the suspension,
      iii. the suspension pH is adjusted to 4.0±0.5,
      iv. water is added to the suspension,
      v. the suspension is mixed for about 1 to about 120 minutes,
      vi. the suspension is washed with water until its conductivity is below 200 µS,
      vii. the suspension pH is adjusted to 4.0±0.5,
      viii. the suspension is deagglomerated to a secondary particle size of less than 1 micron, and
      ix. the suspension is filtered.

* * * * *